United States Patent
Li et al.

(10) Patent No.: US 9,331,302 B2
(45) Date of Patent: May 3, 2016

(54) BLUE LIGHT EMITTING DEVICE AND LIGHT EMITTING DEVICE

(71) Applicant: Industrial Technology Research Institute, Chutung, Hsinchu (TW)

(72) Inventors: Jung-Yu Li, Hsinchu (TW); Shih-Pu Chen, Hsinchu (TW); Yi-Ping Lin, Hsinchu (TW); Cheng-Chang Chen, Hsinchu (TW); Guan-Yu Chen, Hsinchu (TW); Jin-Han Wu, Hsinchu (TW); Cheng-Hung Li, Hsinchu (TW); Huei-Jhen Siao, Hsinchu (TW)

(73) Assignee: Industrial Technology Research Institute, Hsinchu County (TW)

( * ) Notice: Subject to any disclaimer, the term of this patent is extended or adjusted under 35 U.S.C. 154(b) by 0 days.

(21) Appl. No.: 14/625,355

(22) Filed: Feb. 18, 2015

(65) Prior Publication Data
US 2015/0236290 A1 Aug. 20, 2015

Related U.S. Application Data

(60) Provisional application No. 61/941,319, filed on Feb. 18, 2014.

(30) Foreign Application Priority Data

Jun. 30, 2014 (TW) .............................. 103122470 A

(51) Int. Cl.
*H01L 35/24* (2006.01)
*H01L 51/00* (2006.01)
(Continued)

(52) U.S. Cl.
CPC ........ *H01L 51/5209* (2013.01); *H01L 51/5265* (2013.01); *H01L 51/5271* (2013.01); *H01L 51/5044* (2013.01)

(58) Field of Classification Search
CPC ......... H01L 35/24; H01L 51/00; H01L 51/52; H01L 51/5044; H01L 51/5212; H01L 51/5278
USPC .......................................................... 257/40
See application file for complete search history.

(56) References Cited

U.S. PATENT DOCUMENTS 6,670,772 B1    12/2003  Arnold et al.
7,247,394 B2     7/2007  Hatwar et al.
(Continued)

FOREIGN PATENT DOCUMENTS

CN          1551689       12/2004
CN        103000660        3/2013
(Continued)

OTHER PUBLICATIONS

Yates et al., "Suface plasmon-polriton mediated emission from phosphorescent dendrimer light-emitting diodes", Applied Physics Letter, Apr. 2006, pp. 161105-1016105-3. vol. 88.
(Continued)

*Primary Examiner* — Phuc Dang
(74) *Attorney, Agent, or Firm* — Muncy, Geissler, Olds & Lowe, P.C.

(57) ABSTRACT

A blue light emitting device includes an electrode layer, a first metal layer, a second metal layer formed between the electrode layer and the first metal layer, and an organic material layer formed between the first metal layer and the second metal layer and including a blue shift light emitting sub-layer. A peak of a first light-emitting spectrum of the blue shift light emitting sub-layer, which ranges within 490-550 nm, is shifted to a peak of a second light-emitting spectrum, which is less than 510 nm, by the surface plasmon coupling between the first metal layer and the second metal layer. A light emitting device is further provided, which is sequentially stacked with a first metal layer, an organic material layer having a blue shift light emitting sub-layer, a second metal layer having a metal portion and an opening portion, an electrode layer, and a light emitting layer doped with a dopant material, to emit white light.

42 Claims, 14 Drawing Sheets

(51) Int. Cl.
  *H01L 51/52* (2006.01)
  *H01L 51/50* (2006.01)

(56) References Cited

U.S. PATENT DOCUMENTS

| | | |
|---|---|---|
| 8,269,214 B2 | 9/2012 | Smigelski, Jr. et al. |
| 8,415,875 B2 | 4/2013 | Smith et al. |
| 2011/0169399 A1* | 7/2011 | Ito .................. H01L 51/5234 313/504 |
| 2012/0032138 A1 | 2/2012 | Kim et al. |
| 2012/0181920 A1 | 7/2012 | Frischeisen et al. |
| 2012/0223417 A1* | 9/2012 | Ishibashi ............. C30B 29/403 257/615 |
| 2012/0235197 A1 | 9/2012 | Okuyama |
| 2013/0299809 A1* | 11/2013 | Wang ................. H01L 51/5206 257/40 |
| 2015/0083205 A1* | 3/2015 | Fujimoto ............ H01L 31/0725 136/255 |
| 2015/0318513 A1* | 11/2015 | Nakayama ............. H05B 33/26 257/40 |

FOREIGN PATENT DOCUMENTS

| | | |
|---|---|---|
| TW | 200519413 | 6/2005 |
| TW | 201316583 | 4/2013 |

OTHER PUBLICATIONS

Wedge et al., "Suface plasmon-polariton mediated emission of light from top-emitting organic light-emitting diode type structures", Organic Electronics, Jul. 2007, pp. 136-147, vol. 8.

Koller et al., "Surface plasmon coupled electroluminescent emission", Applied Physics Letters, Mar. 2008, pp. 13304-1-13304-3, vol. 92.

Koo et al., Light extraction from organic light-emitting diodes ehanced by spontaneously formed buckles, Nature Photonics, Feb. 2010, pp. 222-226, vol. 4.

Feng et al., "Enhancement of electroluminescence through a two-dimensional corrugated metal film by gratinginduced surface-plasmon cross coupling", Optics Letters, Sep. 2005, pp. 2302-2304, vol. 30, No. 17.

Kim et al., "Highly Enhanced Light Extraction from Surface Plasmonic Loss minimized OLEDs", Advanced Materials, 2013, vol. 25, pp. 3571-3577.

* cited by examiner

BLUE LIGHT EMITTING DEVICE AND LIGHT EMITTING DEVICE

CROSS-REFERENCE TO RELATED APPLICATIONS

This application claims priority to U.S. provisional application No. 61/941,319, filed on Feb. 18, 2014, and Taiwan application no. 103122470, filed on Jun. 30, 2014. The entirety of the above-mentioned patent applications is hereby incorporated by reference herein and made a part of this specification.

TECHNICAL FIELD

This disclosure relates to blue light emitting devices and light emitting devices, and, more specifically, relates to a blue light emitting device and a light emitting device that is free from having blue light emitting materials.

BACKGROUND

Except the advantages of light weight and thin, flexible and low-glare, the organic light-emitting diode (OLED) further has special performances of high color rendering and full spectrum. It quite fits the requirements of current illumination products, such that OLED becomes a focal point of the next generation illumination technology.

In recent years, the efficiency and life span of the R, G, B light emitting materials of the OLED have significantly improved. The efficiency of the green phosphorescent material has been over 100 l m/M, and the life span thereof also has been the top among various colors of illumination materials, which can sustain hundreds of thousands of hours. However, the most critical blue light emitting material in the white light OLED element relatively falls behind.

Although the current efficiency of the blue phosphorescent material has achieved 20.4 cd/A, its life span is merely hundreds of hours. Recently, most of the literature use the phosphorescent material "bis(4,6-difluorophenylpyridinato-N, C2) picolinatoiridium(FIrpic)" as major blue phosphorescent material. The efficiency of FIrpic is high, but the life span of it is not satisfactory. Therefore, the all-phosphorescent white light OLED element is highly efficient though it is not able to be applied in the illumination because of the short life span. In addition, the blue fluorescence material has worse efficiency, which is only 10.2 cd/A, but its life can achieve thirty thousand hours. Thus, the blue fluorescence material is temporarily accepted by the industry. It is generally called hybrid white light OLED element.

For this reason, how to develop a high efficient white light OLED element without using blue light emitting materials (the blue phosphorescent material or the blue fluorescence material) becomes a key issue of the current market.

SUMMARY

The present disclosure is to provide a blue light emitting device and a light emitting device that do not use a blue light emitting material and can still develop a highly efficient while light OLED element.

A blue light emitting device comprises an electrode layer, a first metal layer, a second metal layer formed between the electrode layer and the first metal layer, and an organic material layer formed between the first metal layer and the second metal layer, the organic material layer includes a blue shift light emitting sub-layer, and the peak of a first light-emitting spectrum of the blue shift light emitting sub-layer ranges from 490 nm to 550 nm.

A light emitting device comprises an electrode layer, a first metal layer, a second metal layer formed between the electrode layer and the first metal layer, and an organic material layer formed between the first metal layer and the second metal layer. The organic material layer includes a blue shift light emitting sub-layer and a green light emitting sub-layer. A peak of a first light-emitting spectrum of the blue shift light emitting sub-layer is shifted to a peak of a second light-emitting spectrum by surface plasmon coupling between the first metal layer and the second metal layer. The peak of the first light-emitting spectrum of the blue shift light emitting sub-layer ranges from 490 nm to 550 nm. The peak of the second light-emitting spectrum is less than 510 nm, and is less than the peak of the first light-emitting spectrum.

A light emitting device comprises an electrode layer, a first metal layer, a second metal layer formed between the electrode layer and the first metal layer and including a metal portion and an opening portion, and an organic material layer formed between the first metal layer and the second metal layer. The organic material layer includes a blue shift light emitting sub-layer. A peak of a first light-emitting spectrum of the blue shift light emitting sub-layer is shifted to a peak of a second light-emitting spectrum by surface plasmon coupling between the first metal layer and the second metal layer. The peak of a first light-emitting spectrum of the blue shift light emitting sub-layer ranges from 490 nm to 550 nm. The peak of the second light-emitting spectrum is less than 510 nm, and is less than the peak of the first light-emitting spectrum. The organic material layer further comprises a red light emitting sub-layer, thereby emitting white light.

A light emitting device comprises a first electrode layer, a second electrode layer, a carrier generation layer formed between the first electrode layer and the second electrode layer, a first metal layer formed in the carrier generation layer, a second metal layer formed between the first electrode layer and the carrier generation layer, a first organic material layer formed between the first metal layer and the second metal layer and including a blue shift light emitting sub-layer, and a second organic material layer formed between the carrier generation layer and the second electrode layer. A peak of a first light-emitting spectrum of the blue shift light emitting sub-layer is shifted to a peak of a second light-emitting spectrum by surface plasmon coupling between the first metal layer and the second metal layer. The peak of the first light-emitting spectrum of the blue shift light emitting sub-layer ranges from 490 nm to 550 nm, and the peak of the second light-emitting spectrum is less than 510 nm, and is less than the peak of the first light-emitting spectrum.

A light emitting device comprises an electrode layer, a first metal layer, a carrier generation layer formed between the electrode layer and the first metal layer, a second metal layer formed in the carrier generation layer, a first organic material layer formed between the electrode layer and the carrier generation layer, and a second organic material layer formed between the first metal layer and the second metal layer. The second organic material layer includes a blue shift light emitting sub-layer. A peak of a first light-emitting spectrum of the blue shift light emitting sub-layer is shifted to a peak of a second light-emitting spectrum by surface plasmon coupling between the first metal layer and the second metal layer. The peak of the first light-emitting spectrum of the blue shift light emitting sub-layer ranges from 490 nm to 550 nm, and the peak of the second light-emitting spectrum is less than 510 nm, and is less than the peak of the first light-emitting spectrum.

DETAILED DESCRIPTION

The detail description of the disclosure is described by specific embodiments in the following. Those with ordinary skills in the arts can readily understand the other functions of the disclosure after reading the disclosure of this specification. It should be understand, the structure, proportion, size etc., shown in the appended drawings of this specification, are revealed only to meet the content of the specification for those familiar with the art of understanding and reading, but not intended to limit the qualification disclosure may be implemented. Thus, it does not have a substantial technical meaning. Any structure modification, the ratio between the size of the change or adjustment, without prejudice to the creation of the effect can be produced and that can be achieved under the purpose, should be still falls on the creation of the technical content was revealed to cover the range.

Figure 1A:
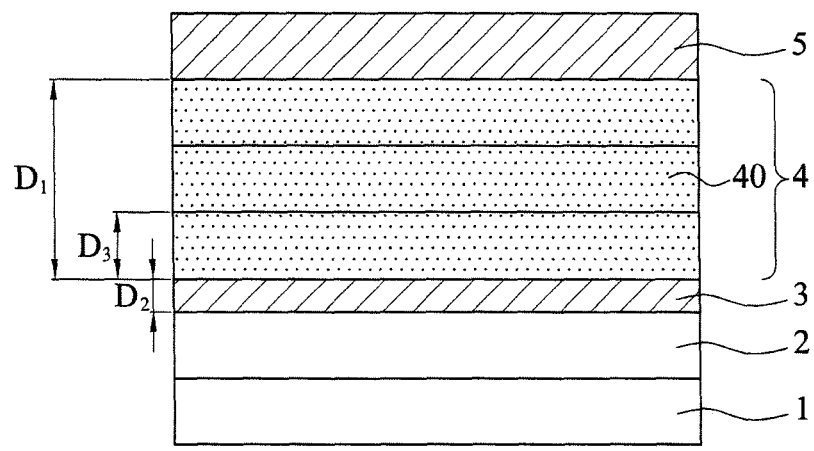
FIG. 1A is a schematic structural diagram of a first embodiment of the disclosure.

According to FIG. 1A, a first embodiment of the disclosure is depicted. The blue light emitting device according to the disclosure comprises an electrode layer 2, a second metal layer 3, an organic material layer 4 including a blue shift light emitting layer 40, and a first metal layer 5, which are stacked in sequence. In an embodiment, a substrate 1 is provided, but not limited to, outside of the electrode layer 2. The substrate 1 can also be provided outside of the first metal layer 5, and can be, for example, a transparent substrate.

One of the electrode layer 2 and the first metal layer 5 is an anode, and the other one is a cathode. The electrode layer 2 is a transparent electrode such as a metal oxide transparent conductive material (e.g., ITO, IZO, etc.). The first metal layer 5 is a reflective electrode, and has a thickness usually greater than 20 nm. In an embodiment, the first metal layer is made of gold, silver, aluminum, platinum, palladium, zinc, nickel, copper, molybdenum, chromium, or the alloy of any combination thereof.

The second metal layer 3 is formed between the electrode layer 2 and the first metal layer 5. The second metal layer 3 can include a metal sub-layer, a nano-metal wire sub-layer, a high-low ladder metal sub-layer, or a combination thereof. In an embodiment, the second metal layer 3 is made of gold, silver, aluminum, platinum, palladium, zinc, nickel, copper, molybdenum, chromium, or the alloy of any combination thereof. The thickness $D_2$ of the second metal layer 3 ranges from 5 nm to 20 nm.

The organic material layer 4 is formed between the second metal layer 3 and the first metal layer 5, and includes a blue shift light emitting sub-layer 40. A peak of a first light-emitting spectrum of the blue shift light emitting sub-layer 40 ranges from 490 nm to 550 nm. In the organic material layer 4, the side of the blue shift light emitting sub-layer 40 near the anode includes a hole injection sub-layer (HIL) (not shown) and a hole transporting sub-layer (HTL) (not shown), and the side near the cathode includes an electron transporting sub-layer (ETL) (not shown) and an electron injection sub-layer (EIL) (not shown). The hole injection sub-layer can be HAT-CN. Such design can assist the injection of the holes of the anode. The blue shift light emitting sub-layer 40 can be formed of a phosphorescent or a fluorescence material.

Figure 1B:
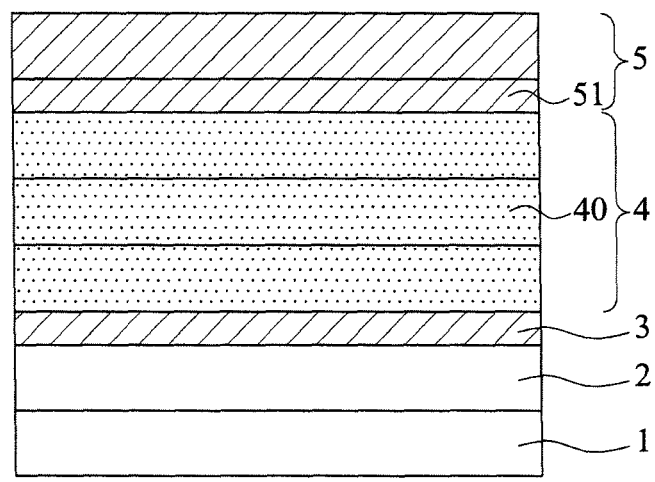
FIG. 1B is a schematic structural diagram of an aspect of the first embodiment of the disclosure.

In the first embodiment shown in FIG. 1A, the blue light emitting device can emit blue light, because, when the organic material layer 4 has a thickness $D_1$, the surface plasmon of the first metal layer 5 and the second metal layer 3 are coupled with each other, resulting in the organic material layer 4 having the light enhancement and wavelength shift phenomenon. Such that, the shift light emitting sub-layer 40 originally emitting green light or blue-green light is able to emit blue light after blue shift by internal surface plasmon coupling. In other words, the peak of the first light-emitting spectrum of the blue shift light emitting sub-layer 40 is shifted to a peak of a second light-emitting spectrum by the surface plasmon coupling between the first metal layer 5 and the second metal layer 3. The peak of a first light-emitting spectrum of the blue shift light emitting sub-layer 40 ranges from 490 nm to 550 nm, and the peak of the second light-emitting spectrum is less than the peak of the first light-emitting spectrum, i.e., less than 510 nm, so as to emit blue light. In addition, if the thicknesses $D_2$ of the first metal layer 5 and of the second metal layer 3 are identical (for example, both of them are 20 nm), the ratio of the distance $D_3$ from the blue shift light emitting sub-layer 40 in the organic material layer 4 to the second metal layer 3 and the distance between the first metal layer 5 and the second metal layer 3 (i.e., the thickness $D_1$ of the organic material layer 4) is about 0.5, so as to let the organic material layer 4 to generate a better light enhancement and wavelength shift phenomenon. If the thicknesses of the first metal layer 5 and of the second metal layer 3 are different (for example, the first metal layer is about 100 nm, and the second metal layer is about 20 nm), the ratio of the distance $D_3$ from the blue shift light emitting sub-layer 40 in the organic material layer 4 to the second metal layer 3 and the distance between the first metal layer 5 and the second metal layer 3 (i.e., the thickness $D_1$ of the organic material layer 4) is larger than 0.5, so as to let the organic material layer 4 generate a better light enhancement and wavelength shift phenomenon. Moreover, as shown in FIG. 1B, the first metal layer 5 is a multilayer structure, the material of a metal layer 51 near the organic material layer 4 in the multilayer structure is identical with the second metal layer 3. For example, both of them are silver.

Figure 2:
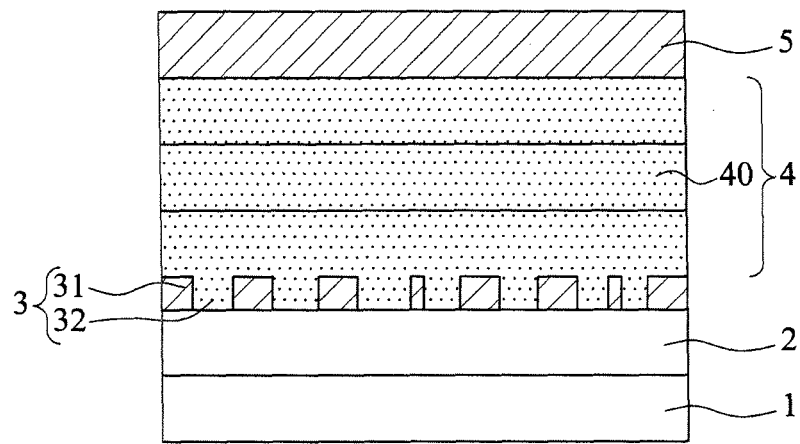
FIG. 2 is a schematic structural diagram of a second embodiment of the disclosure.

Next, FIG. 2 describes a second embodiment according to the disclosure. The difference between the second and the first embodiments is that in the second embodiment the second metal layer 3 includes a metal portion 31 and an opening portion 32, as shown in FIG. 2. The second metal layer 3 can be a mesh shaped metal layer or a grating shaped metal layer. The grating shaped metal layer or the mesh shaped metal layer can be formed by using thermal evaporation, electron beam evaporation, sputtering evaporation to form films and by lithography. In addition, the second metal layer 3 can be a metal layer consisting of nano-wires. The second metal layer 3 can be made of metal having high conductivity and high transmittance, such as aluminum, gold, silver, chrome, or the composite material, such as molybdenum/aluminum/molybdenum alloy. The mesh shaped metal layer can be in a structure of a vertical mesh, a regular hexagonal mesh, or other shapes.

In the second embodiment shown in FIG. 2, the blue light emitting device can emit blue light and green light (or blue-green light). The peak of the first light-emitting spectrum of the blue shift light emitting sub-layer 40 is shifted to a peak of a second light-emitting spectrum by the surface plasmon coupling between the first metal layer 5 and the metal portion 31. The peak of the first light-emitting spectrum is not changed by the first metal layer 5 and the opening portion 32. More specifically, the emitted light of the organic material layer 4 corresponding to the opening portion 32 of the mesh shaped metal layer is enhanced to green light without blue shift, and the emitted light of the organic material layer 4 corresponding to the metal portion 31 of the mesh shaped metal layer is blue light after shift. Also, the larger the opening ratio (i.e., (the light emitting area of the organic material layer 4–the area of the second metal layer 3)/(the area of the organic material layer 4)), the lower intensity and color temperature of the blue light after blue shift. On the contrary, the smaller the opening ratio is, the higher intensity and color temperature of the blue light after blue shift become. That is, the larger the area of the metal portion 31 is, the larger the area emitting blue light becomes.

Figure 3:
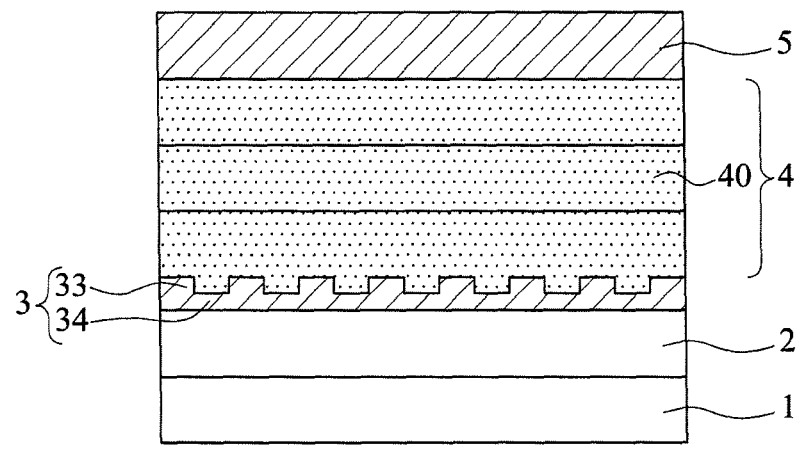
FIG. 3 is a schematic structural diagram of a third embodiment of the disclosure.

Next, FIG. 3 describes a third embodiment of the disclosure. The difference between the third and the first embodiments is that in the third embodiment the second metal layer 3 is a high-low ladder metal layer. In the third embodiment shown in FIG. 3, the blue light emitting device can emit dark blue light and light blue light. More specifically, the emitted light of the organic material layer 4 corresponding to the high ladder portion 33 of the second metal layer 3 is dark blue, and the emitted light of the organic material layer 4 corresponding to the low ladder portion 34 of the second metal layer 3 is light blue. Additionally, the light blue light may be treated as blue-green light. The thickness of the high ladder portion 33 is about 5 to 20 nm, the thickness of the low ladder portion 34 is about 5 to 10 nm, and the thickness of the high ladder portion 33 is greater than the thickness of the low ladder portion 34.

Figure 4:
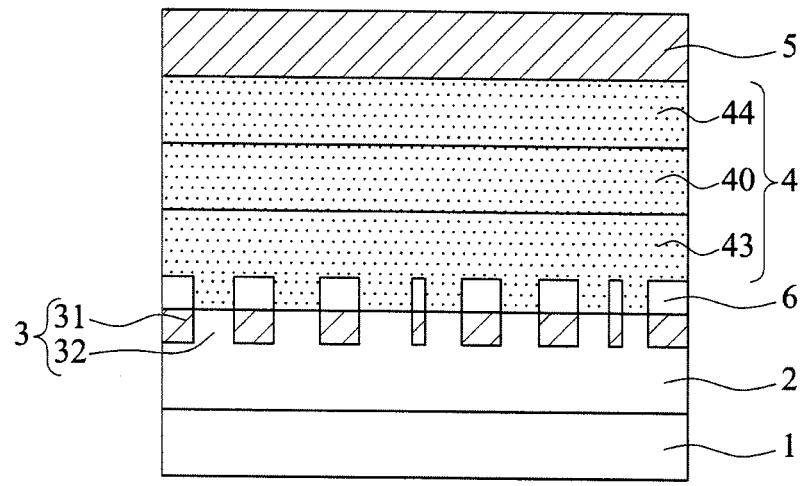
FIG. 4 is a schematic structural diagram of a forth embodiment of the disclosure.

In addition, as a forth embodiment shown in FIG. 4, a conductive layer 6 can be further formed between the organic material layer 4 and the second metal layer 3. The second metal layer 3 includes the metal portion 31 and the opening portion 32. The conductive layer 6 is a patterned transparent conductive layer. In the structure shown in FIG. 4, the electrode layer 2 is the anode, and the first metal layer 5 is the cathode. The organic material layer further includes a hole injection/transporting sub-layer 43 formed between the blue shift light emitting sub-layer 40 and the second metal layer 3, and an electron injection/transporting sub-layer 44 formed between the blue shift light emitting layer 40 and the first metal layer 5.

Figure 5:
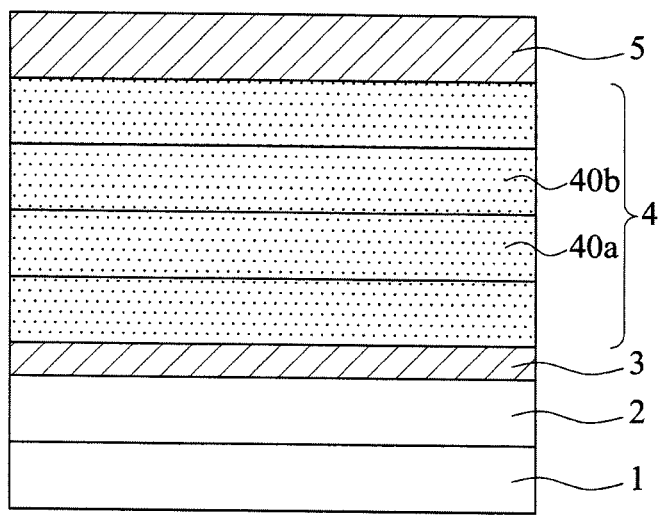
FIG. 5 is a schematic structural diagram of a fifth embodiment of the disclosure.

Next, the fifth embodiment as shown in FIG. 5 depicts that the second metal layer 3 can be a metal layer, a nano-metal wire layer, a high-low ladder metal layer, or a combination thereof. The organic material layer 4 includes a blue shift light emitting sub-layer 40a, a green light emitting sub-layer 40b, and a dopant material. The dopant material can exist in either one of the blue shift light emitting sub-layer 40a and the green light emitting sub-layer 40b or can exist in both of them. The peak of the light-emitting spectrum of the green light emitting layer 40b ranges from 500 nm to 570 nm. The dopant material is, for example, a green, a red, a blue-green or a yellow dopant material.

In a fifth embodiment shown in FIG. 5, the blue shift light emitting sub-layer 40a emits the blue light after shift by the surface plasmon coupling between the first metal layer 5 and the second metal layer 3, the green light emitting sub-layer 40b emits the enhanced green light by the first metal layer 5 and the second metal layer 3, and the dopant material (e.g., red) emits red light, such that the light emitting device of the fifth embodiment emits white light. Furthermore, the dopant material can be selected according to the requirements of white light.

Figure 6:
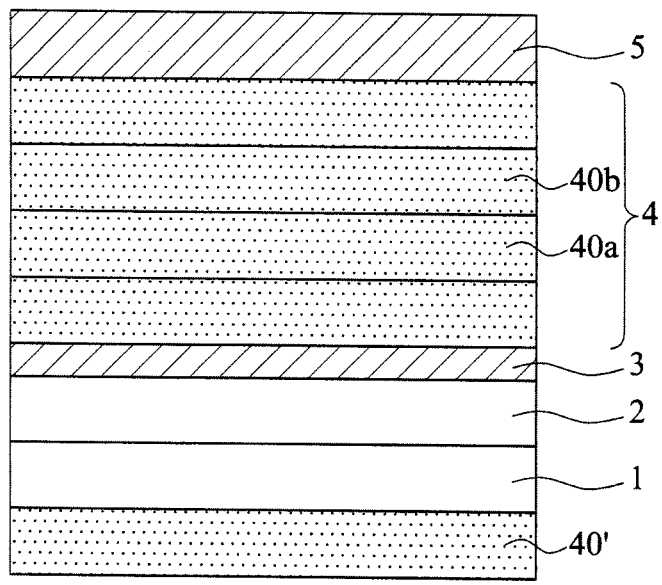
FIG. 6 is a schematic structural diagram of a sixth embodiment of the disclosure.

As shown in FIG. 6, the difference between the sixth embodiment and the fifth embodiment shown in FIG. 5 is that in the sixth embodiment the blue shift light emitting sub-layer 40a and the green light emitting sub-layer 40b are not doped with the dopant material. The light emitting device comprises a light emitting layer 40' formed outside of the electrode layer 2 and the substrate 1. The light emitting layer 40' is doped with a red, a blue-green, or a yellow dopant material and so on. The light emitting layer 40' can also be a phosphor combined with polydimethylsiloxane (PDMS). The light emitting device of the sixth embodiment emits white light.

Figure 7:
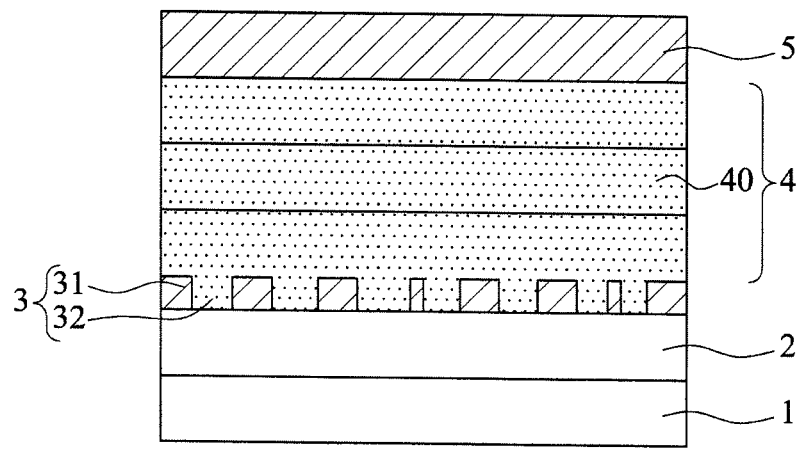
FIG. 7 is a schematic structural diagram of a seventh embodiment of the disclosure.

Next, the seventh embodiment is shown in FIG. 7. In this embodiment, the second metal layer 3 includes a metal portion 31 and an opening portion 32. The organic material layer comprises a blue shift light emitting sub-layer 40, and the blue shift light emitting sub-layer 40 is doped with a dopant material, such as a red, a blue-green, or a yellow dopant material. If the blue shift light emitting sub-layer 40 is doped with a red dopant material, the organic material layer 4 can be regarded as comprising the blue shift light emitting sub-layer 40 and a red light emitting sub-layer. In the seventh embodiment shown in FIG. 7, the organic material layer 4 corresponding to the metal portion 31 of the second metal layer 3 emits blue light after shift, and the organic material layer 4 corresponding to the opening portion 32 of the second metal layer 3 emits enhanced green light, which can directly transmit through dopant material (i.e., red) in the organic material layer 4 by the opening portion 32, and then finally mixes with the shifted blue light to form white light. Furthermore, the dopant material can be selected according to the requirements of white light.

Figure 8:
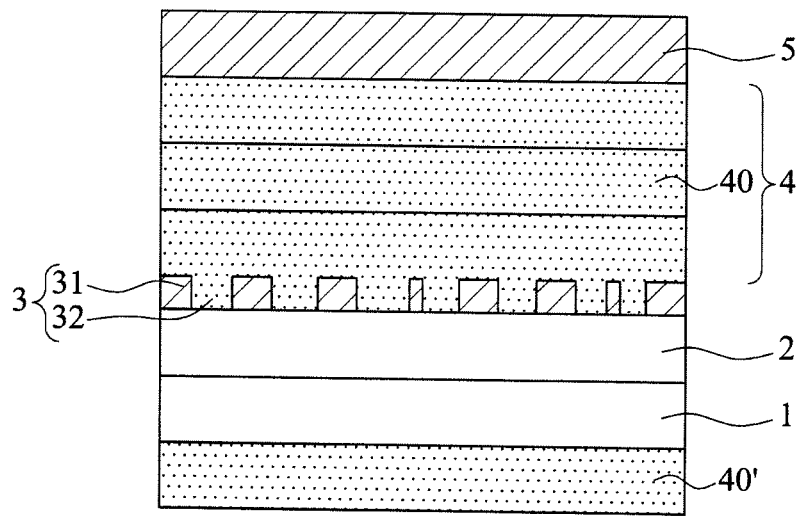
FIG. 8 is a schematic structural diagram of an eighth embodiment of the disclosure.

Next, the eighth embodiment is shown in FIG. 8. The difference between the eighth embodiment and the seventh embodiment is that in the eighth embodiment the dopant material is comprised in a light emitting layer 40' formed outside of the electrode layer 2 and the substrate 1. The light emitting device of the eighth embodiment emits white light.

In addition, in the seventh and eighth embodiments, one of the electrode layer 1 and the first metal layer 5 is the anode, and the other one is the cathode.

Figure 9:
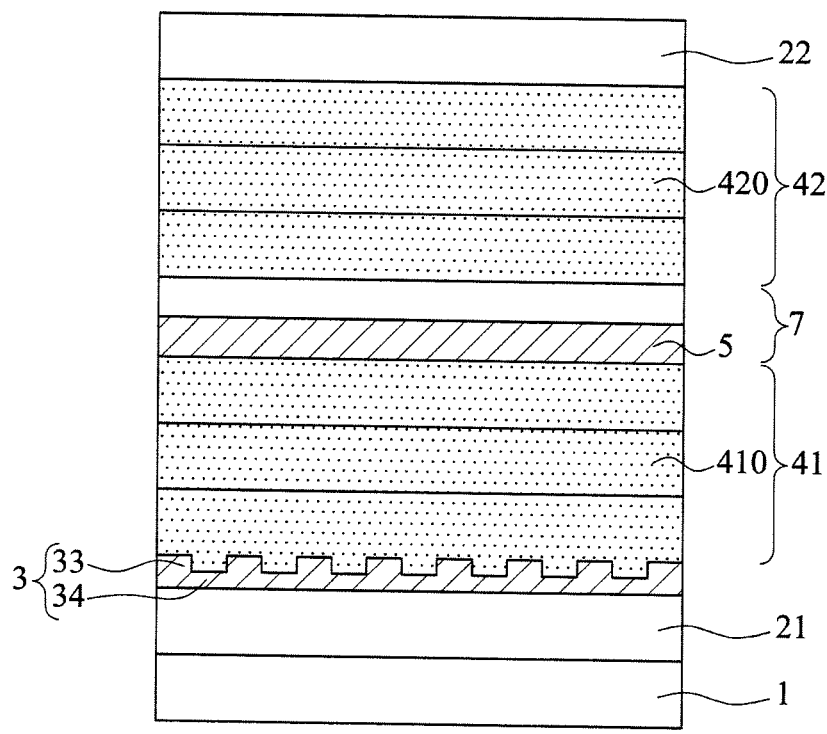
FIG. 9 is a schematic structural diagram of a ninth embodiment of the disclosure.

According to FIG. 9 that describes a ninth embodiment of the disclosure, the light emitting device according to the disclosure comprises a first electrode layer 21, a second metal layer 3, a first organic material layer 41 including a blue shift light emitting sub-layer 410, a carrier generation layer 7 including a first metal layer 5, a second organic material layer 42 including a light emitting sub-layer 420, and a second electrode sub-layer 22, which are stacked in sequence.

In an embodiment, a substrate 1 is provided, but not limited to, outside of the first electrode layer 21. The substrate 1 can also be provided outside of the second electrode layer 22, and the substrate 1 can be, for example, a transparent substrate. One of the first electrode layer 21 and the second electrode layer 22 is the anode, and the other one is the cathode. Either one of the anode and the cathode is a transparent electrode or both of them are transparent electrodes.

The carrier generation layer 7 is formed between the first electrode layer 21 and the second electrode layer 22. The carrier generation layer 7 can be formed by metal (i.e., aluminum) or doped with metal (i.e., aluminum) in different concentrations or ratio of the materials, and can be treated as including the first metal layer 5. The second metal layer 3 is formed between the first electrode layer 21 and the carrier generation layer 7. In an embodiment, the second metal layer 3 can be a metal layer, a nano-metal wire layer, a high-low stepped metal layer, or a combination thereof.

The first organic material layer 41 is formed between the first metal layer 5 and the second metal layer 3, and includes the blue shift light emitting sub-layer 410. The peak of the first light-emitting spectrum of the blue shift light emitting sub-layer 410 is shifted to a peak of a second light-emitting spectrum by the surface plasmon coupling between the first metal layer 5 and the second metal layer 3. The peak of a first light-emitting spectrum ranges from 490 nm to 550 nm. The peak of the second light-emitting spectrum is less than 510 nm. The second organic material layer 42 is formed between the carrier generation layer 7 and the second electrode layer 3, including a light emitting layer 420 doped with a first dopant material and a second dopant material. The first dopant material can be a green light emitting material with the peak that ranges from 500 nm to 570 nm, and the second dopant material can be a red, a blue-green, or a yellow dopant material. By the surface plasmon coupling of the first metal layer 5 and the second metal layer 3, the light emitting device of the ninth embodiment emits white light.

Figure 10:
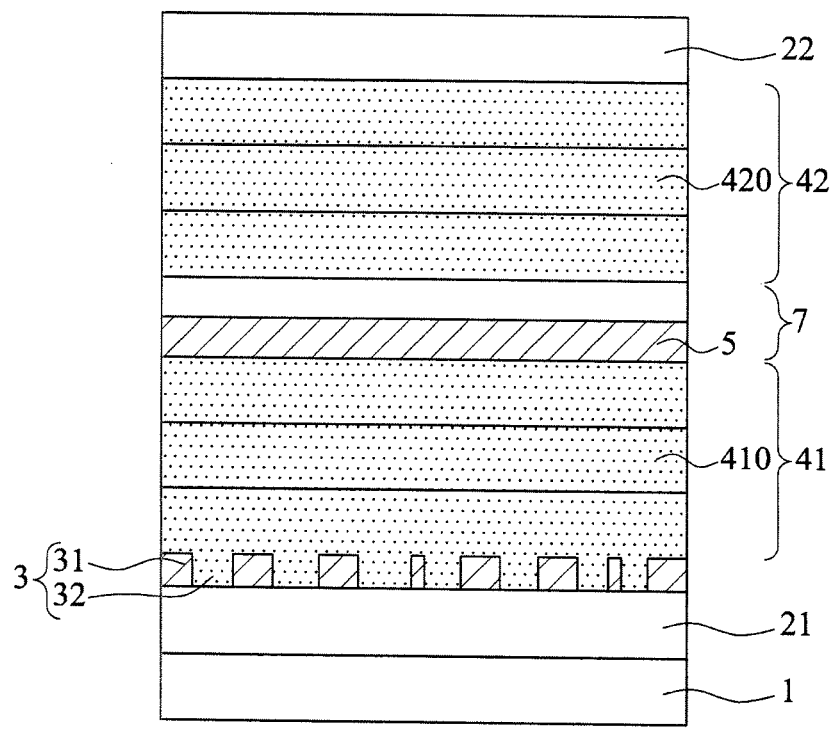
FIG. 10 is a schematic structural diagram of a tenth embodiment of the disclosure.

Next, refer to the tenth embodiment shown in FIG. 10. In an embodiment, the second metal layer 31 includes a metal portion 31 and an opening portion 32. The second metal layer 3 can be a metal layer, a nano-metal wire layer, a high-low stepped metal layer, or a combination thereof. The peak of the first light-emitting spectrum of the blue shift light emitting sub-layer 410 is shifted to the peak of the second light-emitting spectrum by the surface plasmon coupling between the first metal layer 5 and the metal portion 31. There is no surface plasmon coupling between the first metal layer 5 and the opening portion 32, so the peak of the first light-emitting spectrum will not change. The second organic material layer 42 includes a light emitting sub-layer 420 doped with a dopant material. The dopant material is, for example, a red, a blue-green, or a yellow material. Thus, the light emitting device of the tenth embodiment emits white light.

Figure 11:
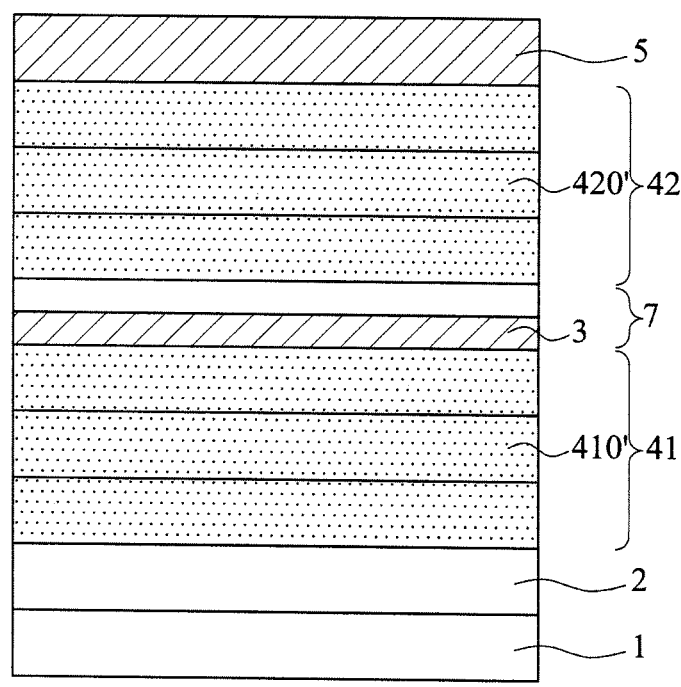
FIG. 11 is a schematic structural diagram of an eleventh embodiment of the disclosure.

According to FIG. 11 that describes an eleventh embodiment according to the disclosure, the light emitting device of the eleventh embodiment comprises an electrode layer 2, a first organic material layer 41 including a light emitting sub-layer 410', a carrier generation layer 7 including a second metal sub-layer 3, a second organic material layer 42 including a blue shift light emitting sub-layer 420', and a first metal layer 5. In an embodiment, a substrate 1 is provided, but not limited to, outside of the electrode layer 2. The substrate 1 can also be provided outside of the first metal layer 5, and the substrate 1 can be, for example, a transparent substrate.

In an embodiment, the electrode layer 2 is the anode, and the first metal layer 5 is the cathode. The carrier generation layer 7 is formed between the electrode layer 2 and the first metal layer 5. The carrier generation layer 7 can be formed by metal (i.e., aluminum) or doped with metal (i.e., aluminum) in different concentrations or ratio of the material, and can be treated as including the second metal layer 3. In an embodiment, the second metal layer 3 can by a metal layer, a nano-metal wire layer, a high-low ladder metal layer, or a combination thereof.

The first organic material layer 41 is formed between the carrier generation layer 7 and the electrode layer 2, including the light emitting sub-layer 410' doped with a first dopant material and a second dopant material. The first dopant material can be a green light emitting material, and the second dopant material can be a red, a blue-green, or a yellow dopant material. The second organic material layer 42 is formed between the first metal layer 5 and the second electrode layer 3, including the blue shift light emitting sub-layer 420'. The peak of the first light-emitting spectrum of the blue shift light emitting sub-layer 420' is shifted to a peak of a second light-emitting spectrum by the surface plasmon coupling between the first metal layer 5 and the second metal layer 3. The peak of a first light-emitting spectrum ranges from 490 nm to 550 nm. The peak of the second light-emitting spectrum is less than 510 nm. By the surface plasmon coupling of the first metal layer 5 and the second metal layer 3, the light emitting device of the eleventh embodiment emits white light.

Figure 12:
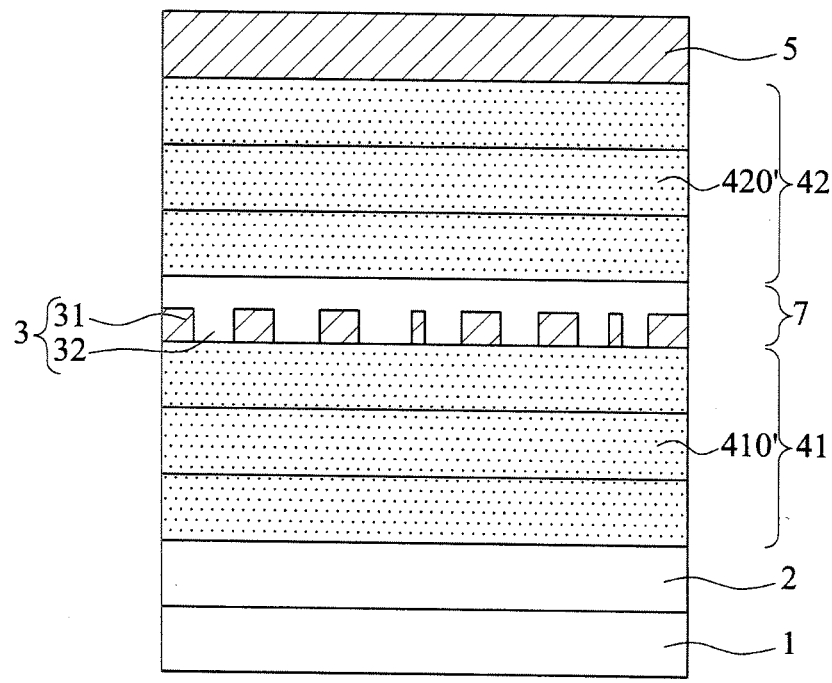
FIG. 12 is a schematic structural diagram of a twelfth embodiment of the disclosure.

Next, a twelfth embodiment is shown in FIG. 12. The difference between the twelfth embodiment and the eleventh embodiment is that in the twelfth embodiment the second metal layer 3 can be a grating shaped metal layer, a mesh shaped metal layer, or a metal layer consisting of nano-wires, and includes a metal portion 31 and an opening portion 32. The peak of the first light-emitting spectrum of the blue shift light emitting sub-layer 420' is shifted to the peak of the second light-emitting spectrum by the surface plasmon coupling between the first metal layer 5 and the metal portion 31. There is no surface plasmon coupling between the first metal layer 5 and the opening portion 32, so the peak of the first light-emitting spectrum will not change. The first organic material layer 41 includes a light emitting sub-layer 410' doped with a dopant material. The dopant material is, for example, a red, a blue-green, or a yellow material. Thus, the light emitting device of the twelfth embodiment emits white light.

Figure 13:
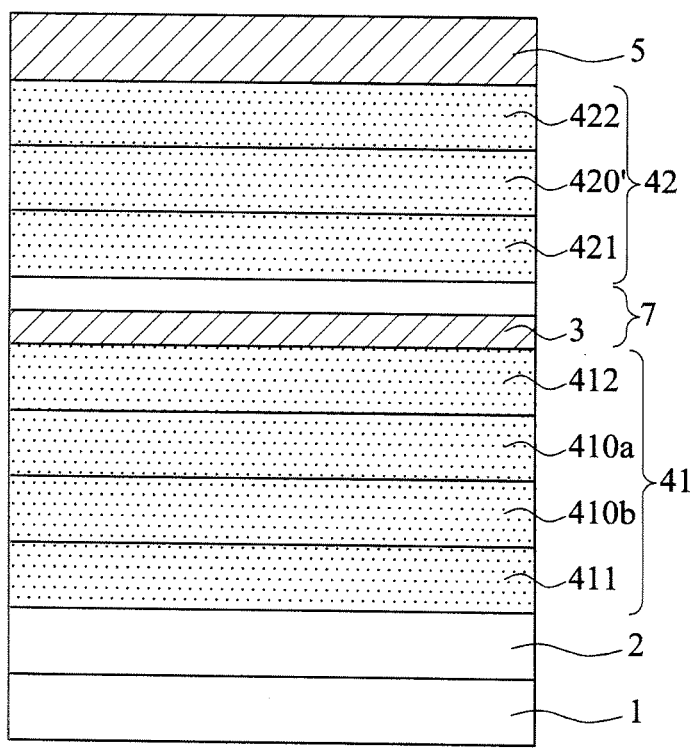
FIG. 13 is a schematic structural diagram of a thirteenth embodiment of the disclosure.

According to FIG. 13 that describes a thirteenth embodiment of the disclosure, the difference between the thirteenth embodiment and the eleventh embodiment is that in the thirteenth embodiment the electrode layer 2 and the first metal layer form the anode, and the carrier generation layer 7 and the second metal layer 3 form the cathode. The first organic material layer 41 further includes a green light emitting sub-layer 410*a* and a light emitting sub-layer 410*b* doped with a dopant material. The dopant material can be a red, a blue-green, or a yellow dopant material. The side of the first organic material layer 41 near the electrode layer 2 includes a hole injection/transporting sub-layer (HIL/HTL) 411, and the side of the first organic material layer 41 near the second metal layer 3 includes an electron injection/transporting sub-layer (EIL/ETL) 412. The side of the blue shift light emitting sub-layer 420' near the first metal layer 5 includes a hole injection/transporting sub-layer (HIL/HTL) 422, and the side of the blue shift light emitting layer 420' near the second metal layer 3 includes an electron injection/transporting sub-layer (EIL/ETL) 421.

Figure 14:
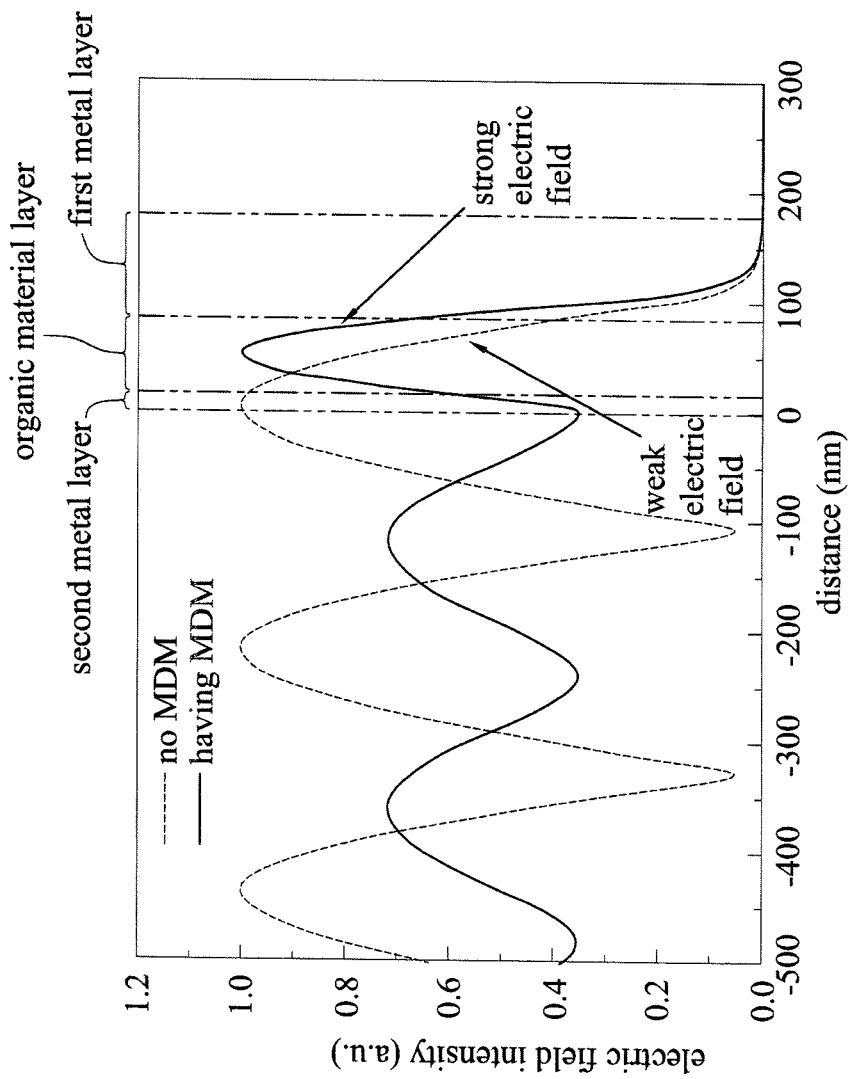
FIG. 14 is a schematic diagram of electrical field distribution of surface plasmon coupling according to the disclosure.

In the disclosure, the organic material layer (or the first organic layer, the second organic layer, summarized as the organic material layer in the following) is sandwiched between the first metal layer and the second metal layer, so as to form an MDM structure, i.e., a metal/dielectric/metal structure. The organic material layer, if having a specific thickness, can result in surface plasmon generated in both of the first metal layer and the second metal layer. The surface plasmon on the first metal layer and the second metal layer will couple with each other and produce a strong electric field. As shown in FIG. 14, the strong electric field affects the electronic transition probability in the organic material layer, and then affects its light enhancement and wavelength shift phenomenon. In FIG. 14, when the thickness of the second metal layer is 15 nm, the thickness of the first metal layer is 100 nm, and the thickness of the organic material layer is 90 nm, the strong electric field is located in the organic material layer. Compared with a weak electric field without the MDM structure located in the organic material layer, the disclosure results in the wavelength of the organic material layer shift, so as to make the blue shift light emitting layer emit blue light after blue shift.

Next, Table 1 lists the simulation result. The simulation conditions of the light emitting device are selecting the peak of the light-emitting spectrum of an organic material layer being 530 nm, fixing the thickness of the first metal layer (Al) to be 100 nm, varying the thickness of the second metal layer (Al) (shown as $D_2$) and the thickness of the organic material layer (shown as $D_1$), and making combinations of different thicknesses. The relationship of the thickness of the second metal layer and the organic material layer is shown in Table 1. When varying the thickness of the second metal layer $D_2$ and the thickness of the organic material layer $D_1$, the light emitting device with the peak of the light-emitting spectrum being 530 nm can emit different light wavelength range according to different thicknesses.

TABLE 1

| $D_2$(nm) | $D_1$(nm) | | | | | | | | | | | |
|---|---|---|---|---|---|---|---|---|---|---|---|---|
| | 75 | 80 | 85 | 90 | 95 | 100 | 105 | 110 | 115 | 120 | 125 | 130 |
| 5 | 470 | 484 | 508 | 530 | 551 | 573 | 595 | 617 | 639 | 661 | 683 | 704 |
| 10 | 423 | 445 | 470 | 484 | 506 | 527 | 548 | 570 | 589 | 613 | 632 | 656 |
| 15 | 410 | 431 | 459 | 474 | 492 | 514 | 534 | 555 | 575 | 597 | 617 | 640 |
| 20 | 405 | 426 | 449 | 470 | 487 | 508 | 529 | 550 | 570 | 592 | 612 | 635 |

Figure 15:
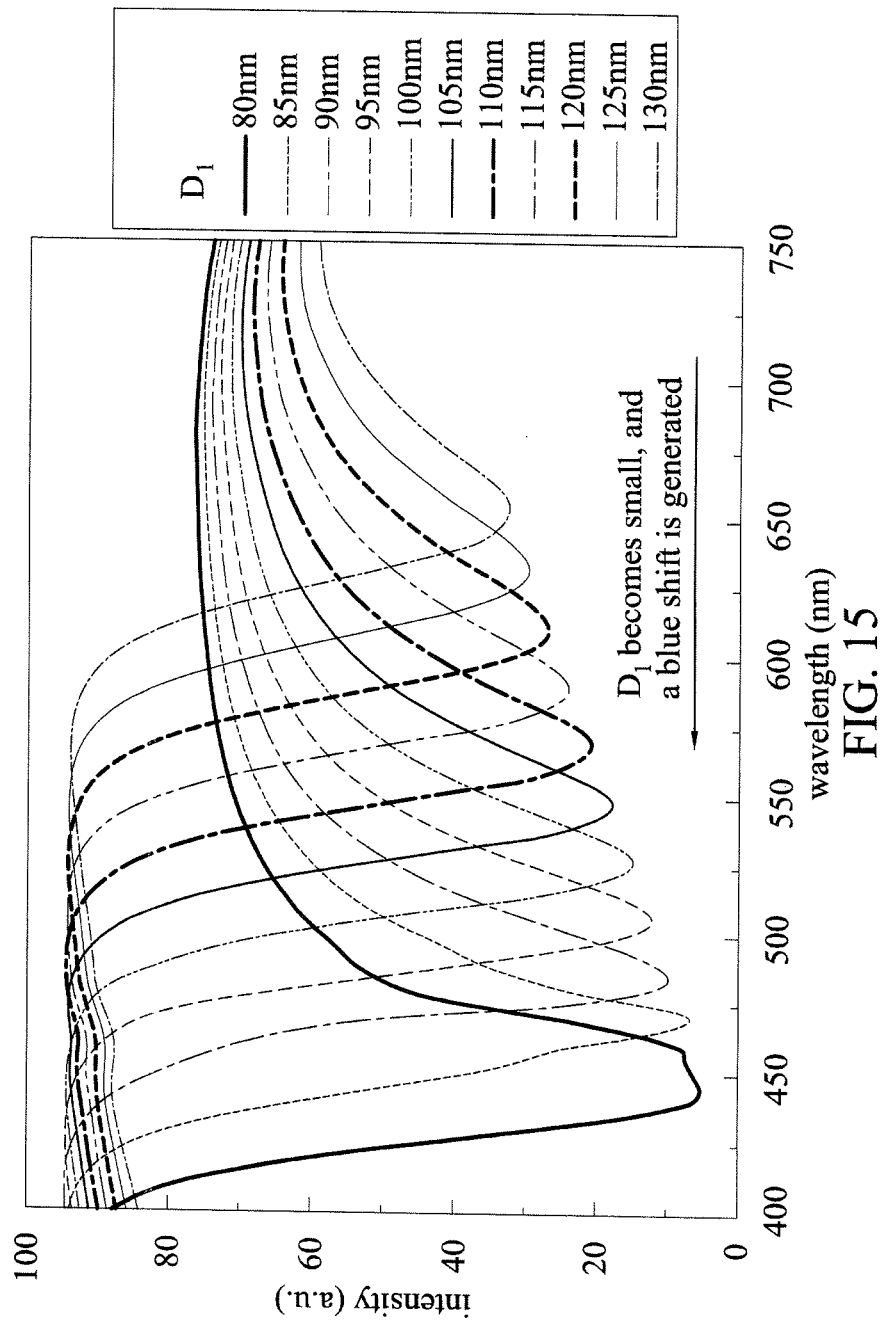
FIGS. 15 and 16 are the relationship of the reflectivity and wavelength of the surface plasmon coupling simulation according to the disclosure.
Figure 16:
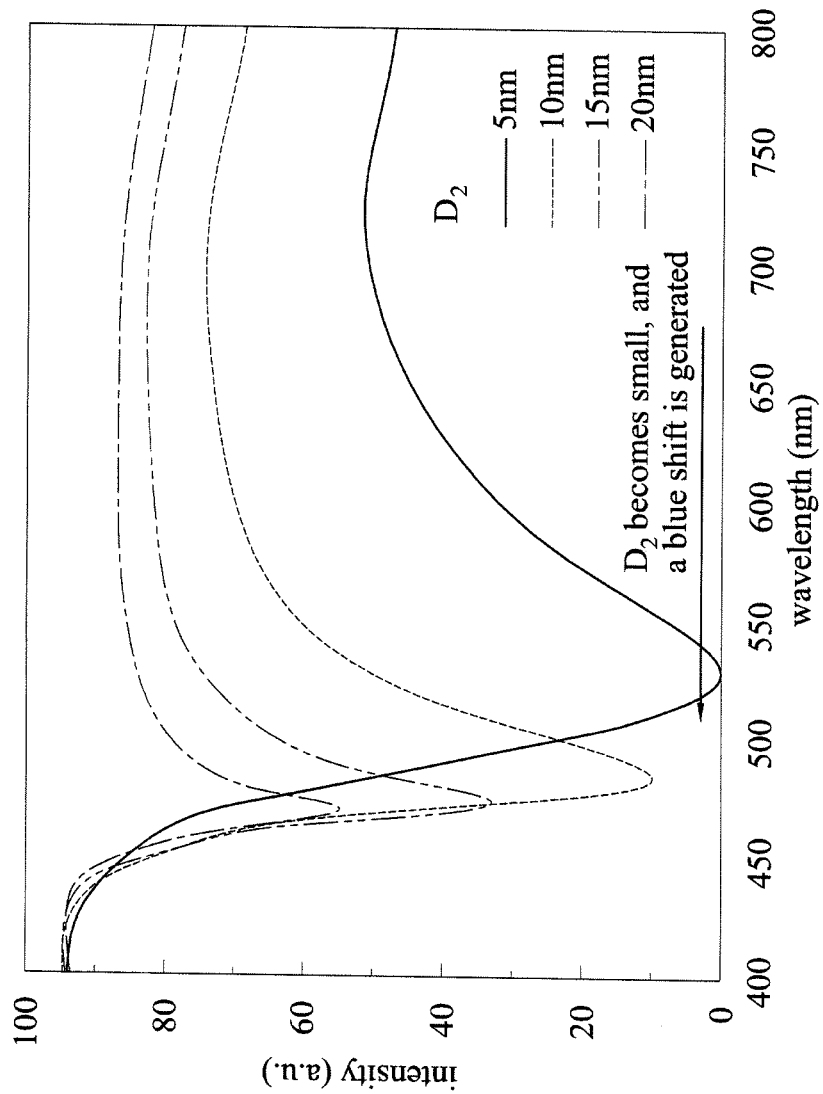

According to Table 1, the peaks of the wavelength of the emitted light including 470 nm, 508 nm, 474 nm, 484 nm, 487 nm, 492 nm, 506 nm, (as the bold frames shown in Table 1) are blue shift of blue light wavelength, and the peaks of the wavelength in 530 nm, 527 nm, 548 nm, 534 nm, 529 nm (as the dashed frames shown in Table 1) are the range of green light enhancement. Furthermore, based on the simulation result, as shown in FIG. 15 and FIG. 16, as the thickness $D_1$ of the organic material layer different from the thickness $D_2$ of the second metal layer, the blue shift phenomenon and the light intensity of the light generated by the light emitting device are different. As such that, it can be perceived that when the thickness $D_1$ of the organic material layer is about 80 nm to 130 nm, the reflectance of the specific wavelength reaches the lowest value. It means that there is higher ratio of the energy of the incidence light transferring to the surface plasmon, so the light intensity of the light emitting device is higher.

Figure 17:
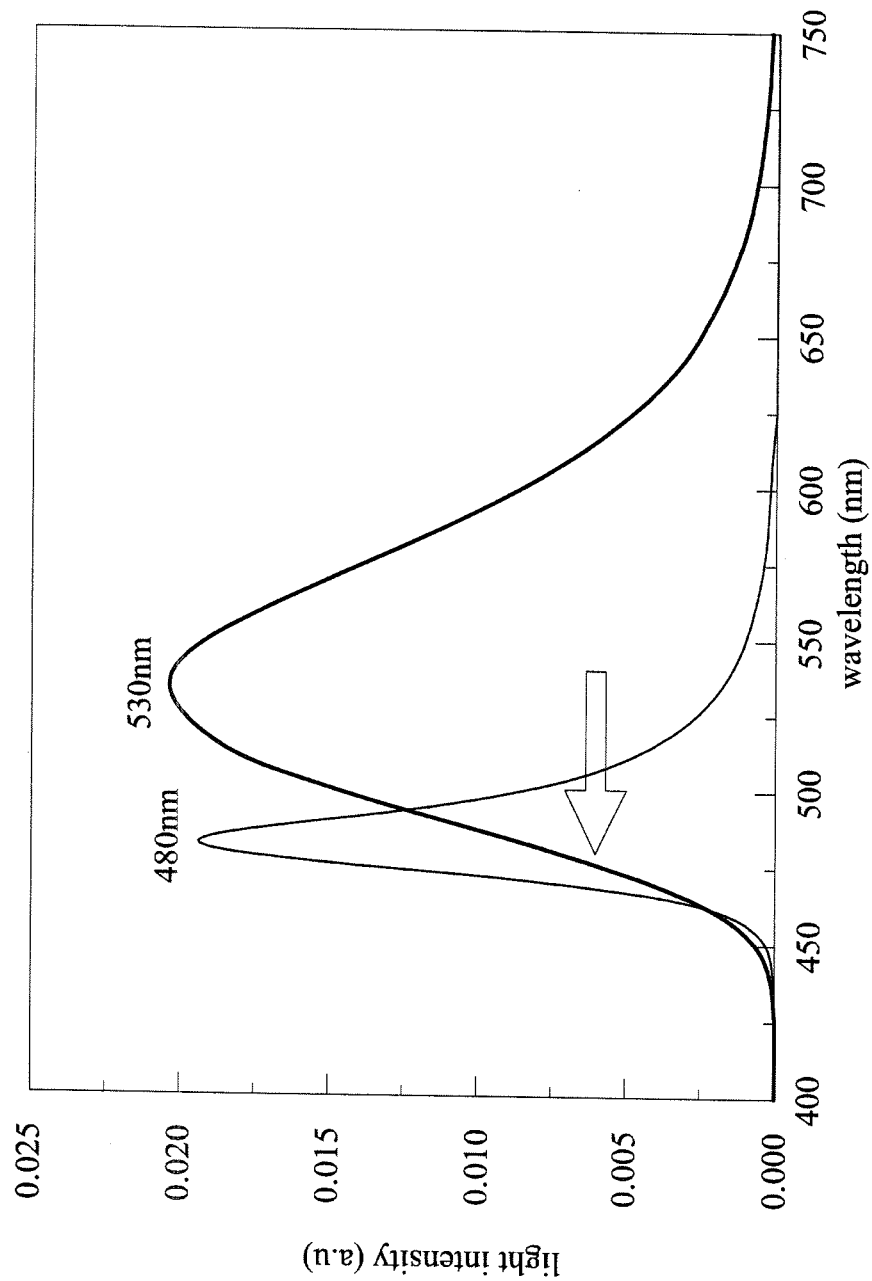
FIG. 17 is a schematic diagram of wavelength shift according to the disclosure.

FIG. 17 shows that the organic material layer used in the simulation conditions originally emitted the green light with 530 nm wavelength, and then emitted blue light with about 480 nm wavelength, after the surface plasmon coupling between the first metal layer and the second metal layer of the disclosure and blue shift. The material of the blue shift light emitting layer such as the blue fluorescence material "Thermally Activated Delayed Fluorescence (TADF)," the phosphorescent material "24FTir(acac)(bis[2-(4',6'-difluorophenyl)-5-trimethylsilylpyridinato-N, C2']iridium(III) acetylacetonate)," and the phosphorescent material "Ir(ppy)$_3$ (Tris[2-phenylpyridinato-C2,N]iridium(III))," can generate blue shift blue light, but not limited to, for example, the light efficiency of the blue shift blue light generated by Ir(ppy)$_3$ can achieve 13 cd/A, which is larger than 9.9 cd/A of the blue fluorescence material. It shows that the blue shift light emitting layer of the disclosure can indeed replace the blue fluorescence material. In the meanwhile, the light emitting efficiency of the whole light emitting device can be improved by a longer life span of the green light emitting layer. Further according to FIG. 17, the shift peak was still located in the range of the original light-emitting spectrum. It can be seen that the wavelength range of the light emitted by the organic material layer between the first metal layer and the second metal layer includes part of blue light (the wavelength is about 450 nm to 490 nm), so as to be able to emit blue light after shifting the wavelength.

Figure 18:
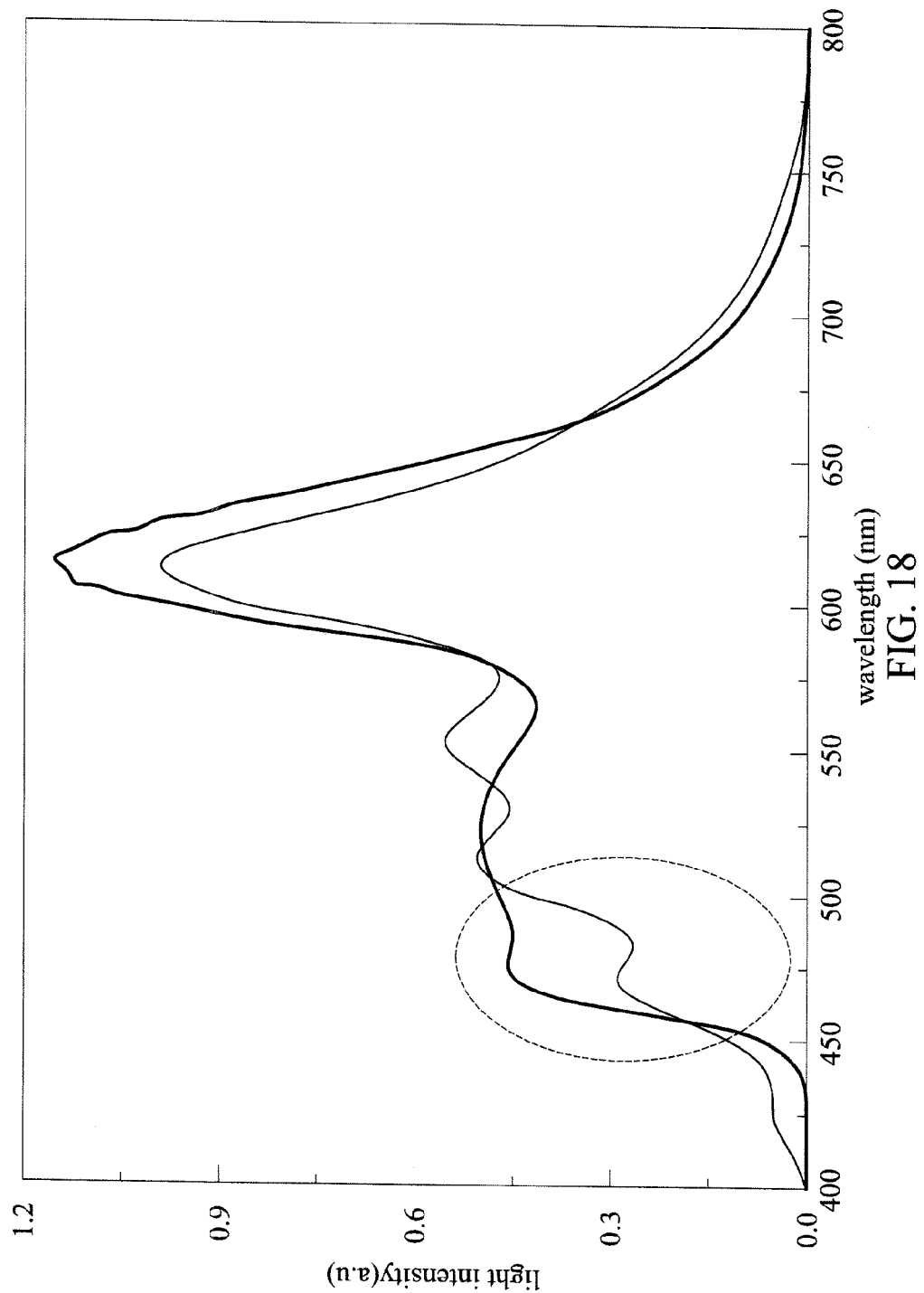
FIG. 18 is a schematic white light spectrum according to the disclosure.

In addition, the light emitting device according to the disclosure combines the dopant material doped with green and red and so on, and can emit white light. FIG. 18 schematically shows the white light spectrum of the light emitting device according to the disclosure (shown by the bold line). In comparison with the white light of a common high rendering (CRI>90) element (shown by the thin line), it can be seen that the spectrum of the light emitting device of the disclosure is quite close to the spectrum of the common high rendering element. The circulated part in the figure is the emitted light after blue shift.

In light of the above, the light emitting device of the disclosure does not need blue light emitting material, but forms the organic material layer between the first metal layer and the second metal layer. By the surface plasmon coupling between the first metal layer and the second metal layer, the peak of the first light-emitting spectrum (about 490 nm to 550 nm) of the blue shift light emitting layer is shifted to a peak of the second light-emitting spectrum (less than 510 nm), and the peak of the second light-emitting spectrum is less than the peak of the first light-emitting spectrum, so as to emit blue shift blue light, and then cooperate with other green or red dopant material and so on to mix them to white light. Therefore, the light emitting device of the disclosure has long life and high light emitting efficiency.

The above embodiments are merely used to describe the effect of the disclosure, but not to limit the disclosure. Those with ordinary skills in the arts can modify or change the above embodiments without departing from the spirit and scope of the disclosure. In addition, the number of devices in the above embodiments is for illustration only, also does not used to limit the disclosure. Accordingly, the scope of the disclosure should follow the appended claims.

What is claimed is:

1. A blue light emitting device, comprising:
an electrode layer;
a first metal layer;
a second metal layer formed between the electrode layer and the first metal layer; and
an organic material layer formed between the first metal layer and the second metal layer and including a blue shift light emitting sub-layer, a first light-emitting spectrum of the blue shift light emitting sub-layer having a peak ranging from 490 nm to 550 nm, wherein the peak of the first light-emitting spectrum of the blue shift light emitting sub-layer is shifted to a peak of a second light-emitting spectrum less than the peak of the first light-emitting spectrum by surface plasmon coupling between the first metal layer and the second metal layer.

2. The blue light emitting device according to claim 1, wherein the second metal layer has a thickness ranging from 5 nm to 20 nm.

3. The blue light emitting device according to claim 1, wherein the second metal layer includes a metal sub-layer, a nano-metal wire sub-layer, a high-low ladder metal sub-layer, or a combination thereof.

4. The blue light emitting device according to claim 1, wherein the peak of the second light-emitting spectrum is less than 510 nm.

5. The blue light emitting device according to claim 1, wherein the second metal layer includes a metal portion and an opening portion.

6. The blue light emitting device according to claim 5, wherein the second metal layer can be a grating shaped metal layer, a mesh shaped metal layer, or a metal layer consisting of nano-wires.

7. The blue light emitting device according to claim 5, wherein the peak of the first light-emitting spectrum of the blue shift light emitting layer is not changed by the first metal layer and the opening portion.

8. The blue light emitting device according to claim 7, wherein the larger an area of the metal portion is, the larger a light emitting area of the blue light emitting device becomes.

9. The blue light emitting device according to claim 1, further comprising at least a conductive layer formed between the second metal layer and the organic material layer.

10. The blue light emitting device according to claim 1, wherein the organic material layer further includes a hole injection sub-layer and a hole transporting sub-layer that are formed between the blue shift light emitting sub-layer and the second metal layer, and an electron injection sub-layer and an electron transporting sub-layer that are formed between the blue shift light emitting sub-layer and the first metal layer.

11. The blue light emitting device according to claim 1, wherein the first metal layer has a multilayer structure, and a metal layer in the multilayer structure near the organic material layer is made of the same material as the second metal layer.

12. A light emitting device, comprising:
an electrode layer;
a first metal layer;
a second metal layer formed between the electrode layer and the first metal layer; and
an organic material layer formed between the first metal layer and the second metal layer and including a blue shift light emitting sub-layer and a green light emitting sub-layer, wherein a peak of a first light-emitting spectrum of the blue shift light emitting sub-layer, which ranges from 490 nm to 550 nm, is shifted to a peak of a second light-emitting spectrum that is less than 510 nm and the peak of the first light-emitting spectrum, by surface plasmon coupling between the first metal layer and the second metal layer.

13. The light emitting device according to claim 12, wherein the second metal layer can be a metal layer, a nano-metal wire layer, a high-low ladder metal layer, or a combination thereof.

14. The light emitting device according to claim 12, wherein the organic material layer further includes a dopant material that is doped in the blue shift light emitting sub-layer or the green light emitting sub-layer.

15. The light emitting device according to claim 12, further comprising a light emitting layer doped with a dopant material and formed on an outside of the electrode layer, wherein the electrode layer is sandwiched between the light emitting layer and the organic material layer.

16. The light emitting device according to claim 12, wherein the second metal layer has a thickness ranging from 5 nm to 20 nm.

17. The light emitting device according to claim 12, wherein the first metal layer has a multi layer structure, and a metal layer in the multilayer structure near the organic material layer is made of the same material as the second metal layer.

18. A light emitting device, comprising:
an electrode layer;
a first metal layer;
a second metal layer formed between the electrode layer and the first metal layer and including a metal portion and an opening portion; and
an organic material layer formed between the first metal layer and the second metal layer and including a blue shift light emitting sub-layer, wherein a peak of a first light-emitting spectrum of the blue shift light emitting sub-layer, which ranges from 490 nm to 550 nm, is shifted to a peak of a second light-emitting spectrum that is less than 510 nm and the peak of the first light-emitting spectrum, by surface plasmon coupling between the first metal layer and the second metal layer.

19. The light emitting device according to claim 18, wherein the second metal layer can be a grating shaped metal layer, a mesh shaped metal layer, or a metal layer consisting of nano-wires.

20. The light emitting device according to claim 18, wherein the organic material layer further comprises a red light emitting sub-layer.

21. The light emitting device according to claim 18, wherein the blue shift light emitting layer further includes a dopant material.

22. The light emitting device according to claim 18, further comprising a light emitting layer doped with a dopant material and formed on an outside of the electrode layer, wherein the electrode layer is sandwiched between the light emitting layer and the organic material layer.

23. The light emitting device according to claim 18, wherein the second metal layer has a thickness ranging from 5 nm to 20 nm.

24. The light emitting device according to claim 18, wherein the electrode layer is an anode, and the first metal layer is a cathode.

25. The light emitting device according to claim 18, wherein the electrode layer is a cathode, and the first metal layer is an anode.

26. The light emitting device according to claim 18, wherein the first metal layer has a multilayer structure, and a metal layer in the multilayer structure near the organic material layer is made of the same material as the second metal layer.

27. A light emitting device, comprising:
   a first electrode layer;
   a second electrode layer;
   a carrier generation layer formed between the first electrode layer and the second electrode layer;
   a first metal layer formed in the carrier generation layer;
   a second metal layer formed between the first electrode layer and the carrier generation layer;
   a first organic material layer formed between the first metal layer and the second metal layer and including a blue shift light emitting sub-layer, wherein a peak of a first light-emitting spectrum of the blue shift light emitting sub-layer, which ranges from 490 nm to 550 nm, is shifted to a peak of a second light-emitting spectrum that is less than 510 nm and the peak of the first light-emitting spectrum, by surface plasmon coupling between the first metal layer and the second metal layer; and
   a second organic material layer formed between the carrier generation layer and the second electrode layer.

28. The light emitting device according to claim 27, wherein the second metal layer can be a metal layer, a nano-metal wire layer, a high-low ladder metal layer, or a combination thereof.

29. The light emitting device according to claim 27, wherein the second organic material layer includes a light emitting sub-layer doped with a first dopant material and a second dopant material.

30. The light emitting device according to claim 27, wherein the second metal layer can be a grating shaped metal layer, a mesh shaped metal layer, or a metal layer consisting of nano-wires.

31. The light emitting device according to claim 27, wherein the second metal layer includes a metal portion and an opening portion, and the peak of the first light-emitting spectrum is shifted to the peak of the second light-emitting spectrum by surface plasmon coupling between the first metal layer and the metal portion.

32. The light emitting device according to claim 31, wherein the second organic material layer includes a light emitting sub-layer doped with a dopant material.

33. The light emitting device according to claim 27, wherein the second metal layer has a thickness ranging from 5 nm to 20 nm.

34. A light emitting device, comprising:
   an electrode layer;
   a first metal layer;
   a carrier generation layer formed between the electrode layer and the first metal layer;
   a second metal layer formed in the carrier generation layer;
   a first organic material layer formed between the electrode layer and the carrier generation layer; and
   a second organic material layer formed between the first metal layer and the second metal layer and including a blue shift light emitting sub-layer, wherein a peak of a first light-emitting spectrum of the blue shift light emitting sub-layer, which ranges from 490 nm to 550 nm, is shifted to a peak of a second light-emitting spectrum that is less than 510 nm and the peak of the first light-emitting spectrum by surface plasmon coupling between the first metal layer and the second metal layer.

35. The light emitting device according to claim 34, wherein the second metal layer can be a metal layer, a nano-metal wire layer, a high-low ladder metal layer, or a combination thereof.

36. The light emitting device according to claim 35, wherein the first organic material layer includes a light emitting layer doped with a first dopant material and a second dopant material.

37. The light emitting device according to claim 34, wherein the electrode layer is a transparent anode, the first metal layer is a metal anode, and the carrier generation layer and the second metal layer constitute a cathode.

38. The light emitting device according to claim 37, wherein the first organic material layer further includes a green light emitting sub-layer and a light emitting sub-layer doped with a dopant material.

39. The light emitting device according to claim 34, wherein the second metal layer can be a grating shaped metal layer, a mesh shaped metal layer, or a metal layer consisting of nano-wires.

40. The light emitting device according to claim 34, wherein the second metal layer includes a metal portion and an opening portion, and the peak of the first light-emitting spectrum is shifted to the peak of the second light-emitting spectrum by surface plasmon coupling between the first metal layer and the metal portion.

41. The light emitting device according to claim 40, wherein the first organic material layer includes a light emitting sub-layer doped with a dopant material.

42. The light emitting device according to claim 34, wherein the second metal layer has a thickness ranging from 5 nm to 20 nm.

* * * * *